United States Patent
Tanaka et al.

(10) Patent No.: US 6,534,864 B1
(45) Date of Patent: Mar. 18, 2003

(54) SEMICONDUCTOR MEMORY DEVICE AND METHOD OF FABRICATING THE SAME

(75) Inventors: Kazuo Tanaka, Sakata (JP); Takashi Kumagai, Chino (JP); Junichi Karasawa, Tatsuno-machi (JP); Kunio Watanabe, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/428,821

(22) Filed: Oct. 28, 1999

(30) Foreign Application Priority Data

Oct. 30, 1998 (JP) .......................................... 10-326186
Oct. 30, 1998 (JP) .......................................... 10-326187
Sep. 14, 1999 (JP) .......................................... 11-260537

(51) Int. Cl.[7] ............................................. H01L 23/48
(52) U.S. Cl. ........................ 257/751; 257/369; 257/753; 257/763; 257/903
(58) Field of Search ................................ 257/369, 371, 257/751, 753, 758, 763, 764, 903; 438/199, 627, 622, 653, 656

(56) References Cited

U.S. PATENT DOCUMENTS

| | | | | | |
|---|---|---|---|---|---|
| 4,884,123 A | * | 11/1989 | Dixit et al. | ................. | 257/751 |
| 4,887,146 A | * | 12/1989 | Hinode | ....................... | 257/751 |
| 5,049,975 A | * | 9/1991 | Ajika et al. | ................. | 257/764 |
| 5,138,425 A | * | 8/1992 | Ichikawa | ..................... | 257/758 |
| 5,237,187 A | * | 8/1993 | Suwanai et al. | ............. | 257/296 |
| 5,319,245 A | * | 6/1994 | Chen et al. | .................. | 257/751 |
| 5,373,178 A | * | 12/1994 | Motoyoshi et al. | .......... | 257/344 |
| 5,518,961 A | * | 5/1996 | Ishimaru | ...................... | 438/586 |
| 5,523,626 A | * | 6/1996 | Hayahsi et al. | .............. | 257/763 |
| 5,528,081 A | * | 6/1996 | Hall | ............................ | 257/768 |
| 5,654,589 A | * | 8/1997 | Huang et al. | ................ | 257/763 |
| 5,831,899 A | * | 11/1998 | Wang et al. | .................. | 365/156 |
| 5,863,833 A | * | 1/1999 | Shin | ............................ | 438/624 |
| 6,137,176 A | * | 10/2000 | Morozumi et al. | .......... | 257/751 |

FOREIGN PATENT DOCUMENTS

| | | |
|---|---|---|
| JP | 07-226387 | 8/1995 |
| JP | 09-055440 | 2/1997 |

\* cited by examiner

*Primary Examiner*—George Eckert
(74) *Attorney, Agent, or Firm*—Hogan & Hartson LLP

(57) ABSTRACT

A semiconductor memory device (SRAM) comprises memory cells, each of which includes two load transistors, two driver transistors and two transfer transistors. The SRAM cell includes a semiconductor substrate in which the transistors are formed, a first interlayer dielectric formed on the semiconductor substrate, first contact portions formed in the first interlayer dielectric and first wiring layers (node wiring layers and pad layers) formed on the first interlayer dielectric. The first contact portions and the first wiring layers include metal layers made of refractory metal and a refractory metal nitride layers. This semiconductor memory device of the present invention is capable of enhancing an integration degree of wiring layers and achieving a microfabrication.

13 Claims, 9 Drawing Sheets

SEMICONDUCTOR MEMORY DEVICE AND METHOD OF FABRICATING THE SAME

BACKGROUND OF THE INVENTION

The present invention relates to a semiconductor memory device and a method of manufacturing the same, particularly to a static random access memory (SRAM) having complementary MOS (CMOS) transistors and a method of manufacturing the same.

As semiconductor integrated circuits are fabricated in a higher integration and in a larger scale, a large scale integrated circuit (LSI) in which a high speed logic circuit and a mass storage memory are mounted on a single semiconductor chip has been generally used. In order to achieve a high speed operation of the semiconductor integrated circuit, it is effective to enhance an integration degree by a scale-down of MOS transistors. Moreover, it is also effective to increase the integration degree and to shorten an average length of the wiring layers by enhancing an integration degree of the wiring layers.

Particularly, a CMOS type memory cell using six MOS transistors has been nowadays used in a large number of CMOS SRAM cells because of its large operation margin and small holding current. However, since the CMOS SRAM cells have a wide memory cell area, a reduction in the memory cell area is required for the CMOS SRAM cells for the sake of the scale-down of devices.

SUMMARY OF THE INVENTION

The object of the present invention is to provide a semiconductor memory device having CMOS transistors and a method of manufacturing the same, which is capable of increasing an integration degree of wiring layers and achieving a scale-down of the device.

The semiconductor memory device of the present invention which comprises memory cells each of which includes two load transistors, two driver transistors and two transfer transistors, the semiconductor memory device comprising:
 a semiconductor substrate in which transistors are formed;
 a first interlayer dielectric formed on the semiconductor substrate;
 first contact portions formed in the first interlayer dielectric; and
 first wiring layers formed on the first interlayer dielectric, wherein the first contact portions and the first wiring layers include metal layers made of refractory metal and refractory metal nitride layers.

According to the semiconductor memory device of the present invention, the first contact portions and the first wiring layers include at least the metal layers made of refractory metal and the refractory metal nitride layer. The metal layers and the nitride layers forming the first wiring layers are preferably continuous to the metal layers and nitride layers forming the first contact portions. Specifically, conductive layers concurrently formed with conductive layers of the first contact portions are also used as the first wiring layers, so that wiring layers having thin film thickness can be formed. Such wiring layers having thin film thickness have an ability to reduce a focus margin in patterning the wiring layers. Accordingly, an integration degree and yield of the first wiring layers can be increased.

It is preferable that the first wiring layers include node wiring layers for connecting impurity diffusion layers of load transistors and impurity diffusion layers of driver transistors, and pad layers for connecting first contact portions and second contact portions.

Each of the node wiring layers comprises a first node wiring layer for connecting an impurity diffusion layer of a first load transistor and an impurity diffusion layer of a first driver transistor interposing one of the first contact portions therebetween, and a second node wiring layer for connecting an impurity diffusion layer of a second load transistor and an impurity diffusion layer of a second driver transistor interposing one of the first contact portions therebetween.

It is preferable that the first wiring layers further include upper conductive layers formed by metal layers made of a refractory metal and refractory metal nitride layers. Adoption of such layer structure is preferable for enhancing a conductivity of the first wiring layers.

The first wiring layers may have conductive layers continuous to plug layers forming the first contact portions, in stead of the upper conductive layers formed of the metal layers made of the refractory metal and the refractory metal nitride layers.

The first contact portions may have insulating layers, which is continuous to a second interlayer dielectric, therein. In this case, the insulating layers may be formed in a formation step of the second interlayer dielectric.

A method of fabricating a semiconductor memory device of the present invention comprises following steps (a) to (e).
 (a) forming memory cells each of which includes two load transistors, two driver transistors and two transfer transistors in predetermined regions of a semiconductor substrate;
 (b) forming a first interlayer dielectric on the semiconductor substrate;
 (c) forming first contact holes in the first interlayer dielectric;
 (d) forming metal layers made of refractory metal and refractory metal nitride layers on surfaces of the first interlayer dielectric and the contact holes; and
 (e) patterning the metal layers and the nitride layers on the first interlayer dielectric, thereby forming first wiring layers.

According to the method of manufacturing the semiconductor memory device, by the steps (d) and (e), the first wiring layers can be formed by the metal layers made of refractory metal and the refractory metal nitride layers, which are formed in the same step of forming conductive layers of the first contact portions (refractory metal layers and refractory metal nitride layers having a barrier function). Accordingly, the first wiring layers can be formed by simpler processes than a case of forming the first wiring layers by doped polysilicon layers or aluminum layers. Moreover, since the refractory metal layers and the refractory metal nitride layers can be formed to have thin thickness, a focus margin in patterning them can be reduced. Accordingly, integration degree and yield of the first wiring layers can be increased.

It is preferable that at least node wiring layers for connecting impurity diffusion layers of the load transistors and impurity diffusion layers of the driver transistors, and pad layers for connecting the first contact portions and second contact portions, are formed in the formation of the first wiring layers.

In the formation of the first wiring layers, upper conductive layers made of refractory metal layers and refractory metal nitride layers may be further formed on the refractory metal layers and the refractory metal nitride layers, in spite of an increase in film formation steps.

In the formation of the first wiring layers, upper conductive layers continuous to plug layers forming the first contact portions may further be formed in the same film formation step as that of forming the plug layers.

In the formation of the first contact portions, insulating layers may be formed in the first contact portions, in the same film formation step as forming a second interlayer dielectric.

The refractory metals should be metals selected from titanium, tungsten, cobalt, molybdenum or the like.

DETAILED DESCRIPTIONS OF THE PREFERRED EMBODIMENTS

Figure 1:
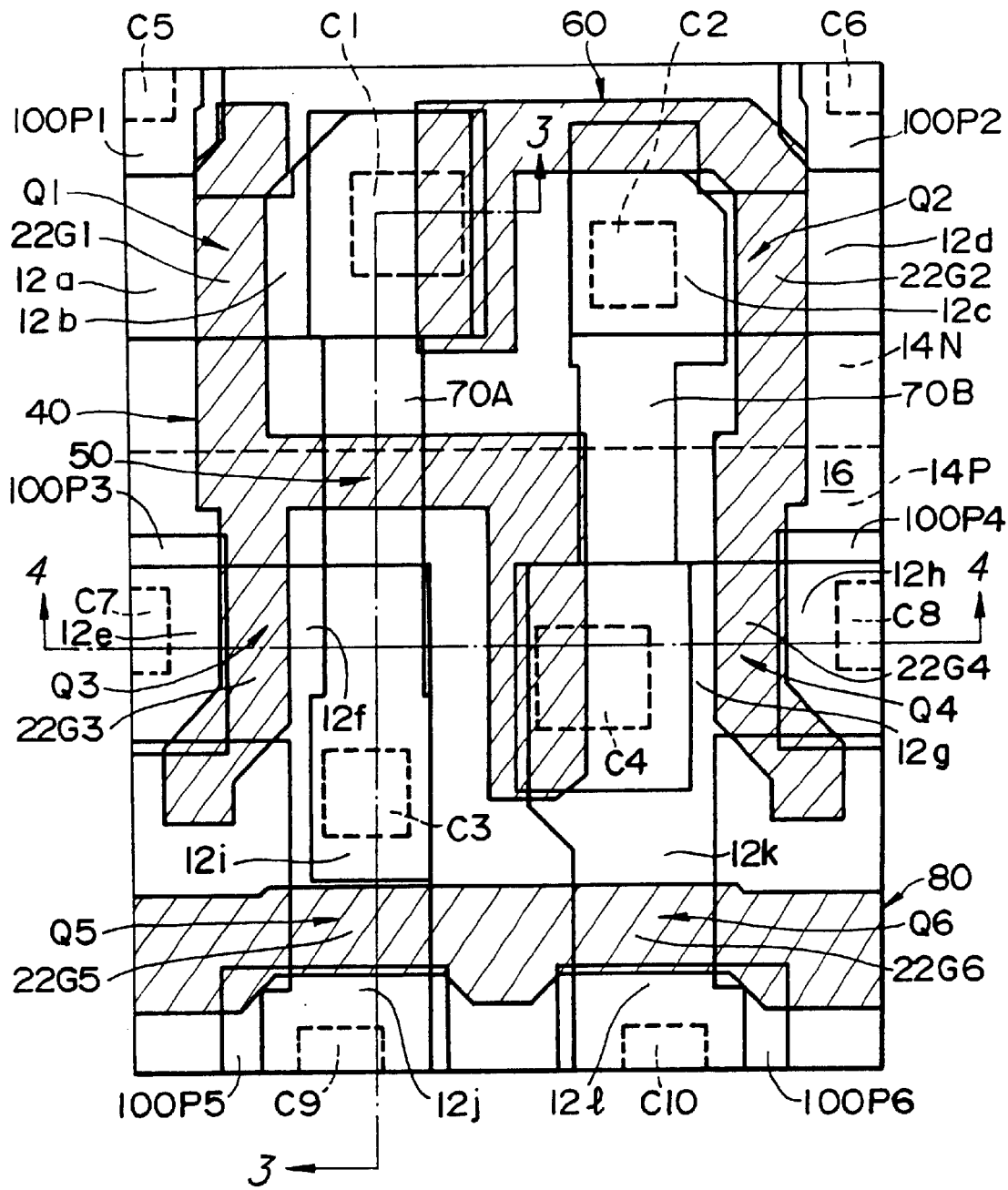
FIG. 1 is a plan view showing a layout of a full CMOS SRAM cell illustrating aspects of the present invention.
Figure 2:
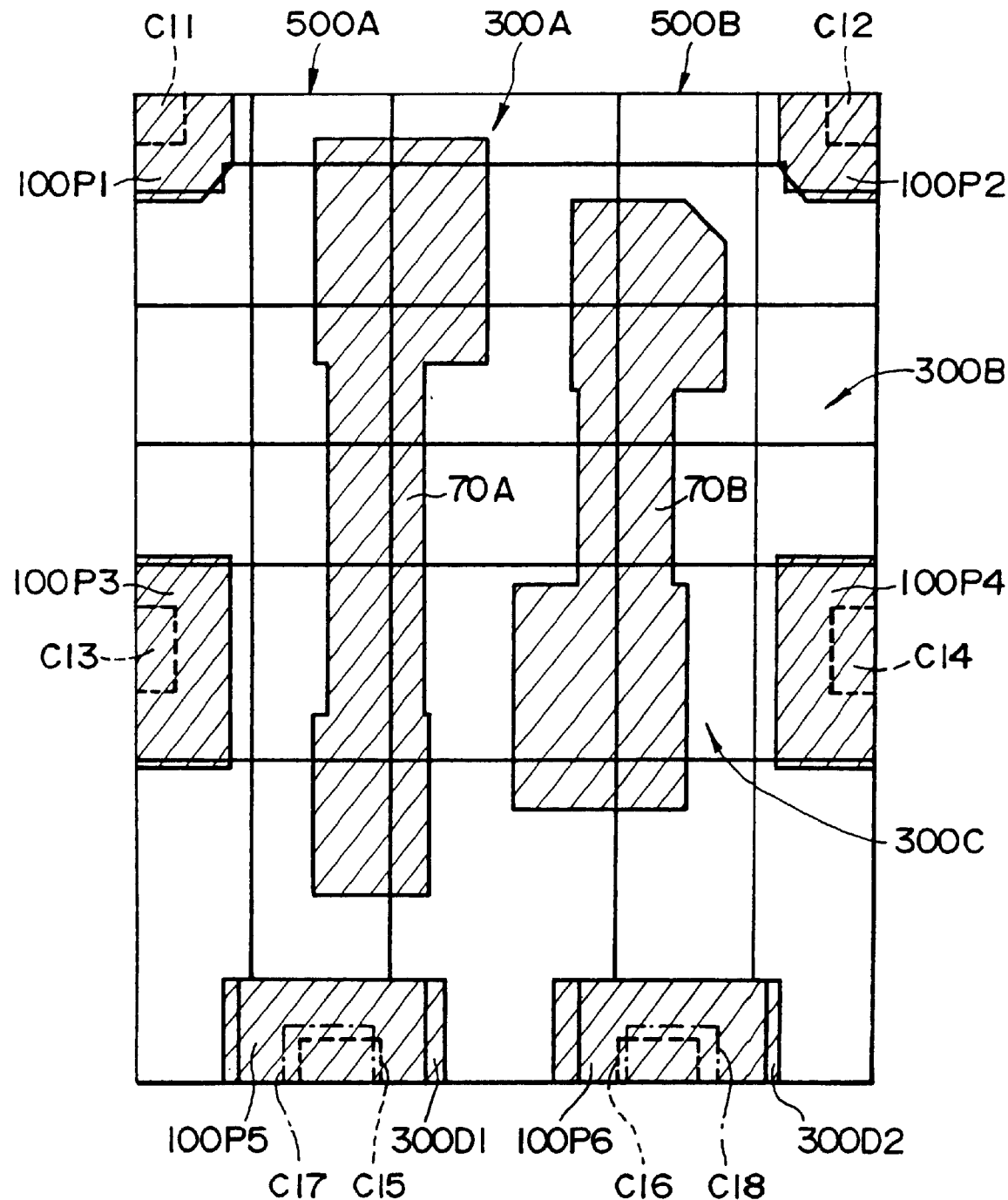
FIG. 2 is a plan view showing a layout at an upper layer of the layout of FIG. 1.
Figure 3:
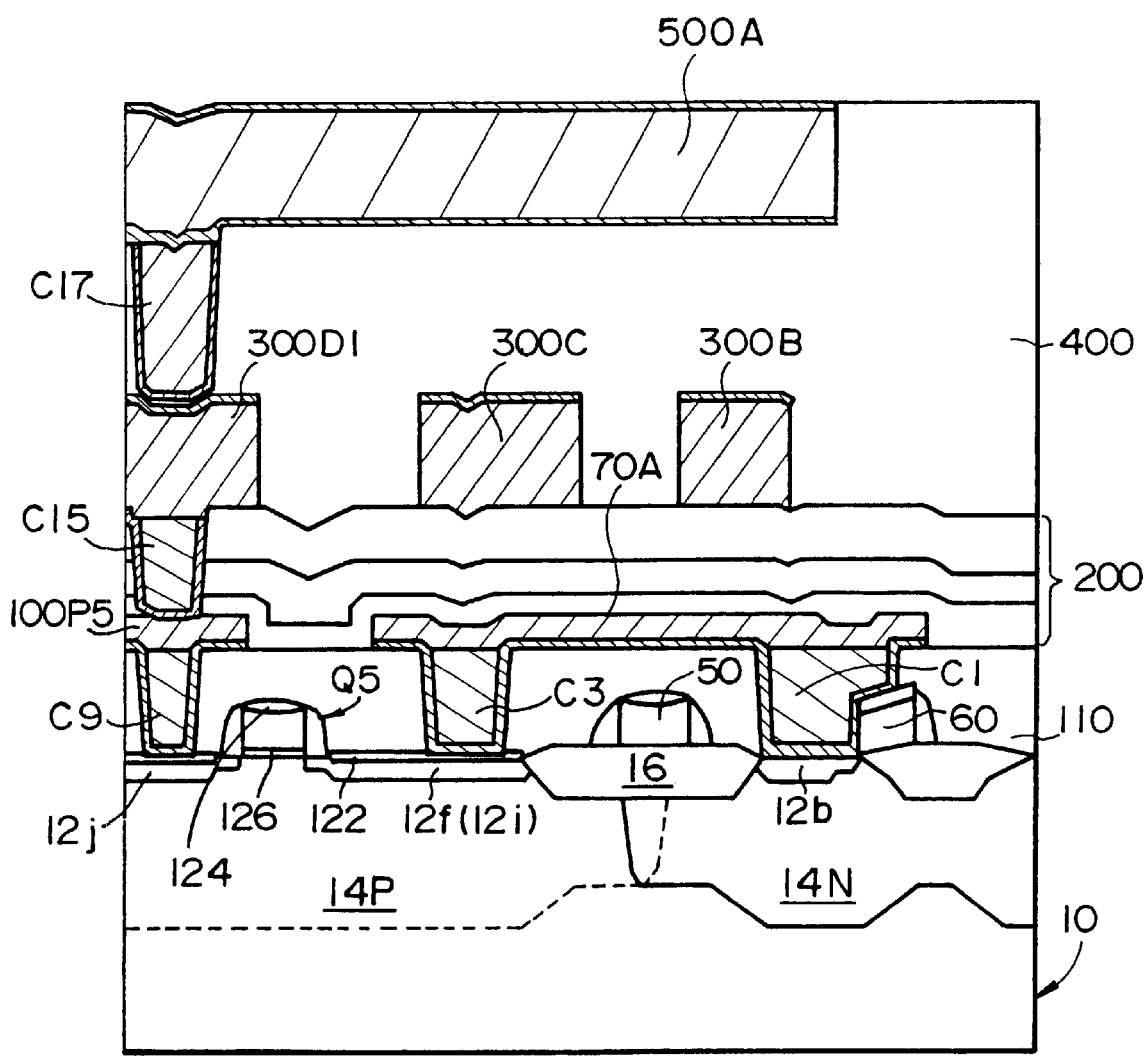
FIG. 3 is a sectional view of the SRAM cell shown in FIG. 1 taken along the 3—3 line.
Figure 4:
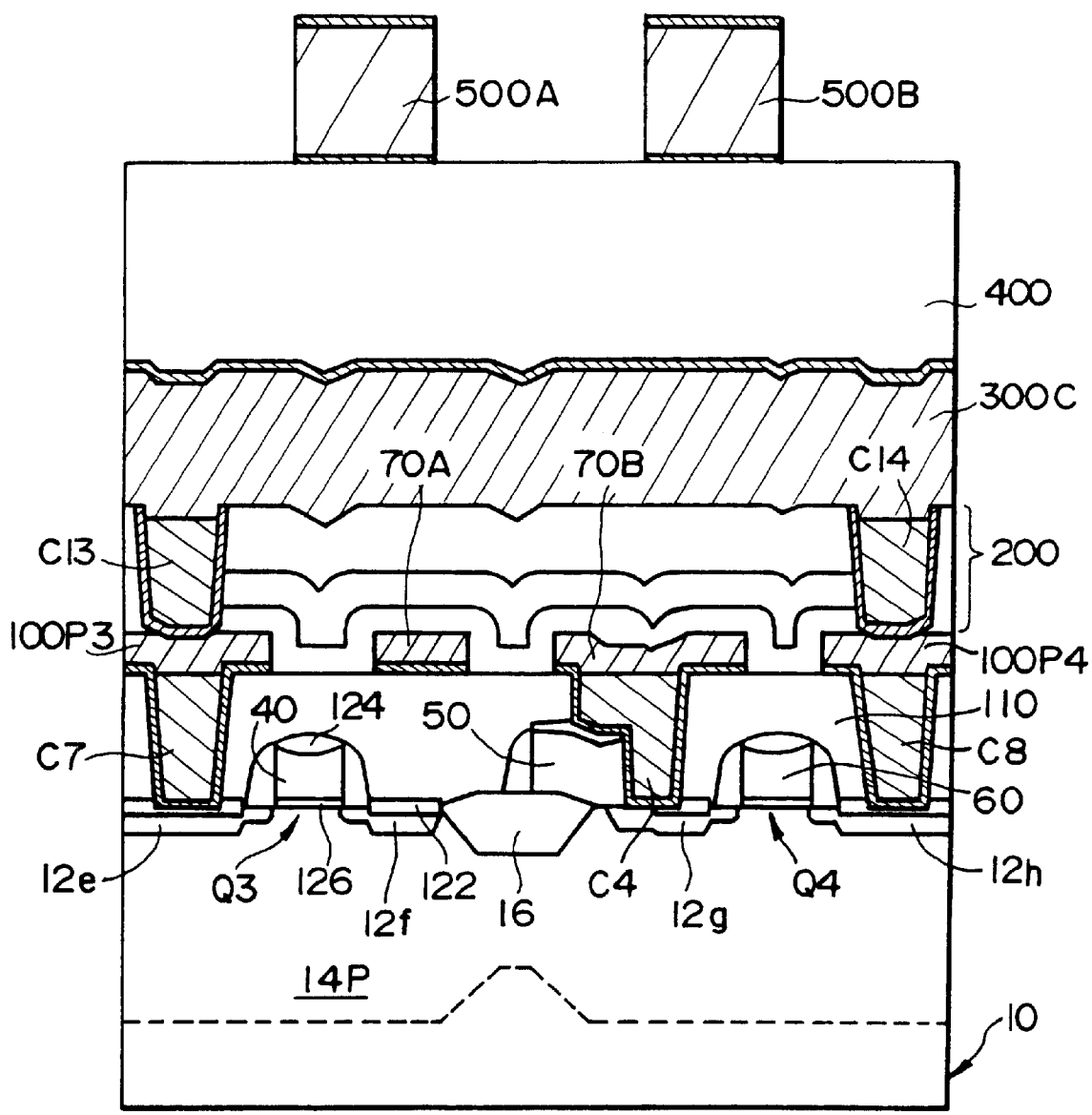
FIG. 4 is a sectional view of the SRAM cell shown in FIG. 1 taken along the 4—4 line.
Figure 6:
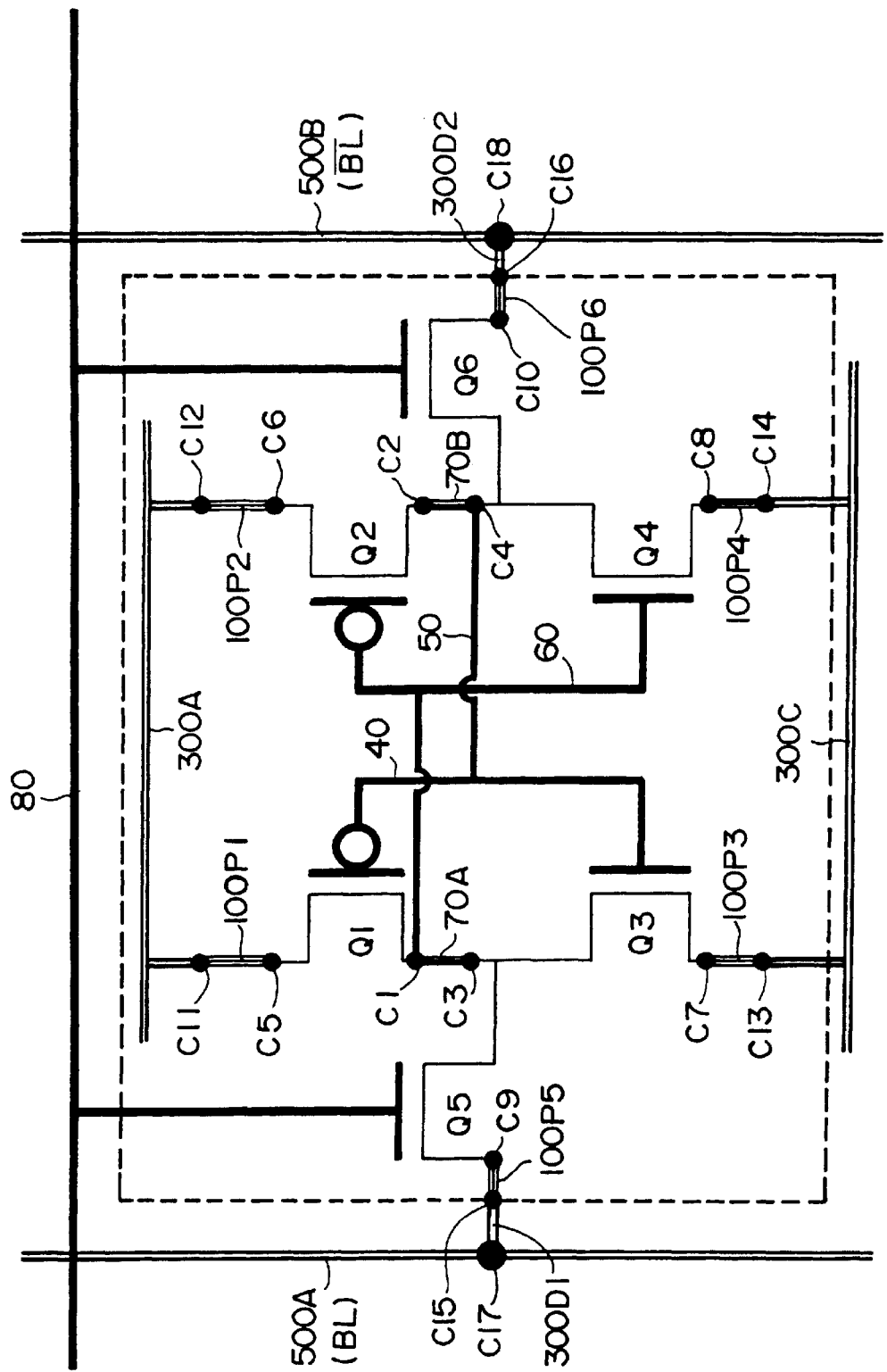
FIG. 6 is an equivalent circuit shown in the layout of the SRAM cell to which aspects of the present invention are applied.
Figure 7:
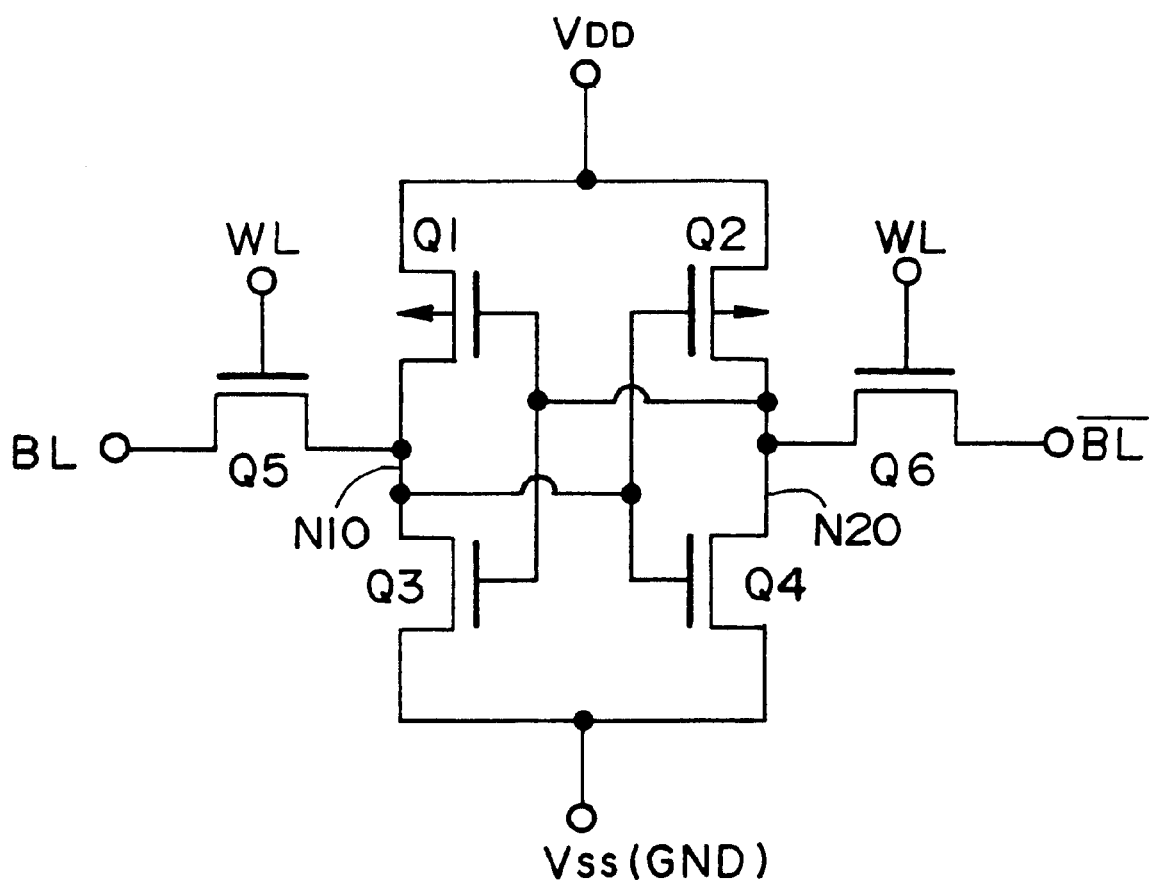
FIG. 7 is an equivalent circuit of a SRAM cell.

FIGS. 1 and 2 are plan views showing a layout of an example of a full CMOS SRAM cell (hereinafter referred to as SRAM cell) according to an embodiment of the present invention. FIG. 3 is a sectional view taken along the 3—3 line of FIG. 1, and FIG. 4 is a sectional view taken along the 4—4 line of FIG. 1. FIG. 6 illustrates an equivalent circuit as shown in the layouts of FIGS. 1 and 2, FIG. 7 is an equivalent circuit of the SRAM. FIG. 1 shows a semiconductor substrate in which transistors are formed, first contact portions and first wiring layers. FIG. 2 shows the first wiring layers, second wiring layers and third wiring layers.

Equivalent Circuit

In the SRAM cell of this embodiment, six transistors Q1 to Q6 are provided in one memory cell as shown in FIGS. 6 and 7. A CMOS inverter is formed by a first load transistor Q1 and a first driver transistor Q3, and another CMOS inverter is formed by a second load transistor Q2 and a second driver transistor Q4. These CMOS inverters are connected to each other, thus forming a flip-flop circuit.

Source/Drain regions of a pair of load transistors Q1 and Q2 are connected to a power source or source/drain regions of a pair of driver transistors Q3 and Q4 are connected to another source (ground) $V_{ss}$. Furthermore, one of the source/drain regions of a pair of transfer transistors Q5 and Q6 are respectively connected to nodes N10 and N20. Another one of source/drain regions of the pair of transfer transistors Q5 and Q6 are respectively connected to bit line BL. Gate electrodes of the transfer transistors Q5 and Q6 are connected to a word line WL, respectively.

Device

In the SRAM cell of this embodiment, the first load transistor Q1 and the first driver transistor Q3 share a first gate electrode layer 40 made of polysilicon as shown in FIGS. 1 and 6. The second load transistor Q2 and the second driver transistor Q4 share a second gate electrode layer 60 made of polysilicon. Furthermore, the first and second transfer transistors Q5 and Q6 share a third gate electrode 80 made of polysilicon.

Planar Structure

Referring to FIG. 1, a planar structure of the SRAM cell according to this embodiment will be described. Active regions isolated from each other are formed in an N type well 14N. The first load transistor Q1 is formed in one active region, and the second load transistor Q2 is formed in the other active region. Two common active regions isolated from each other are formed in a P type well 14P. The first driver transistor Q3 and the first transfer transistor Q5 are formed in one common active region, and the second driver transistor Q4 and the second transfer transistor Q6 are formed in the other common active region.

In FIG. 1, portions where the active regions and the gate electrode layers 40, 60 and 80 intersect form gate electrodes 22G1, 22G2, 22G3, 22G4, 22G5 and 22G6, respectively.

Polysilicon wiring layer 50 formed concurrently with the gate electrode layers 40, 60 and 80 connects the first gate electrode layer 40 and a drain region 12g of the second driver transistor Q4. Furthermore, the second gate electrode layer 60 connects the gate electrode 22G4 of the second driver transistor Q4, the gate electrode 22G2 of the second load transistor Q2 and a drain region 12b of the first load transistor Q1.

Node wiring layers 70A and 70B connect drain regions of the CMOS transistors, respectively. Specifically, the first node wiring layer 70A connects the drain region 12b of the first load transistor Q1 and a drain region 12f of the first driver transistor Q3 through contact portions C1 and C3. The second node wiring layer 70B connects drain region 12c of the second load transistor Q2 and a drain region 12g of the second driver transistor Q4 through contact portions C2 and C4. The polysilicon wiring layer 50 intersects with the node wiring layer 70A in a plan view, and the polysilicon wiring layer 50 and the node wiring layer 70A are electrically isolated from each other by the first interlayer dielectric 110 (see FIG. 3). Furthermore, as shown in FIG. 2, pad layers 100P1 to 100P6 which are formed on the same level as the node wiring layers 70A and 70B so that they overlap respectively with first contact portions C5 to C10. First wiring layers are formed by these node wiring layers 70A and 70B and the pad layers 100P1 to 100P6.

Furthermore, as shown in FIG. 2, wiring layers 300A and 300C forming a power source line are formed as second wiring layers. Wiring layers 500A and 500B forming a bit line are formed as third wiring layers. It should be noted that the second wiring layer 300B is not connected to the memory cell but to a decoder circuit.

Sectional Structure

Next, referring to FIGS. 3 and 4, a sectional structure of the SRAM cell according to this embodiment will be described.

In the SRAM cell according to this embodiment, the P type well 14P and the N type well 14N are formed in the semiconductor substrate 10, and the surfaces of the P and N type wells 14P and 14N are electrically isolated from each other by a field oxide film 16. Moreover, the field oxide film 16 is formed also around the active region of the MOS transistor.

Referring to FIGS. 1 and 3, a sectional view taken along the 3—3 line in FIG. 1 will be first described.

The source/drain region 12 (12b in FIG. 3) of the first load transistor Q1 is formed in the N type well 14N, and the first transfer transistor Q5 is formed in the P type well 14P. Silicide layers 122 are respectively formed on the surfaces of the source/drain regions 12 (12b, 12f, 12i and 12j in FIG. 3). Furthermore, the second gate electrode layer 60 is formed on the field oxide film 16 formed on the N type well 14N. One side wall of the second gate electrode layer 60 on the side to source/drain region 12b is removed.

The first interlayer dielectric 110 is formed on the semiconductor substrate 10 in which the MOS transistor is formed. First contact portions C (C1, C3 and C9 in FIG. 3) connected to the source/drain regions 12 are formed on the first interlayer dielectric 110.

Figure 5:
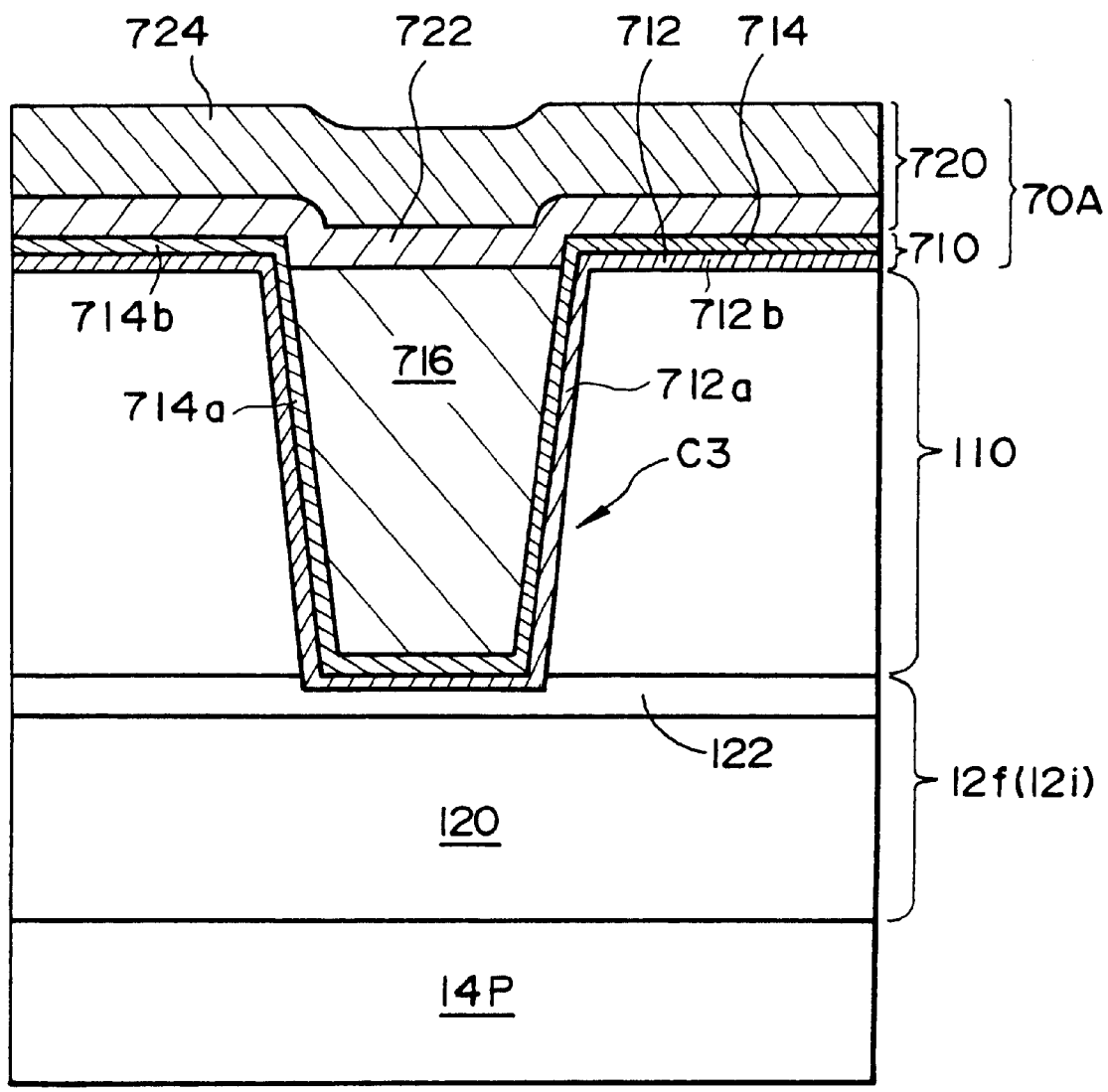
FIG. 5 is a sectional view showing an enlarged principal portion of FIG. 3.

An enlarged view of the region including the contact portion C3 is shown as an example of the first contact portion in FIG. 5.

The source/drain region 12 (12f) comprises of an impurity diffusion layer 120 and the silicide layer 122 formed on the impurity diffusion layer 120. The contact portion C3 comprises a refractory metal layer 712a formed so as to be connected to the silicide layer 122, a nitride layer 714a made of a refractory metal, which is formed on the surface of the refractory metal layer 712a, and a plug layer 716 formed on the surface of the nitride layer 714a so as to fill in the contact hole.

The first wiring layer (the node wiring layer 70A in FIG. 5) comprises a lower conductive layer 710 and an upper conductive layer 720. The lower conductive layer 710 includes a refractory metal layer 712b and a nitride layer 714b made of a refractory metal. The refractory metal layer 712b forming the lower conductive layer 710 and the refractory metal layer 712a forming the first contact portion form a continuous metal layer 712. Moreover, the nitride layer 714b forming the lower conductive layer 710 and the nitride layer 714a forming the first contact portion form a continuous nitride layer 714.

Specifically, the first wiring layer (node wiring layer 70A in FIG. 5) comprises the lower conductive layer 710 which is formed concurrently with the metal layer 712a and the nitride layer 714a forming the first contact portion (contact portion C3 in FIG. 5), and the upper conductive layer 720 which is formed on the lower conductive layer 710.

In the contact portion (C3) and the first wiring layer (70A), the refractory metal layer 712 (712a and 712b) mainly secures a conductivity, and the refractory metal nitride layer 714 (714a and 714b) mainly functions as a barrier layer. Moreover, the conductivity of the first wiring layers can be enhanced by providing the upper conductive layer 720 on the lower conductive layer 710. In this embodiment, the film thickness of the first wiring layers are exemplified as follows.

the refractory metal layer 712 of the lower conductive layer 710; 1 to 20 nm
the refractory metal nitride layer 714 of the lower conductive layer 710; 10 to 300 nm
the refractory metal layer 722 of the upper conductive layer 720; 1 to 100 nm
the refractory metal nitride layer 724 of the upper conductive layer 720; 10 to 500 nm In FIG. 3, the first wiring layers, the node wiring layer 70A for connecting the drain region 12b of the first load transistor Q1 and the drain region 12f of the first diver transistor Q2, and the pad layer 100P5 connected to the source region 12j of the first transfer transistor Q5 through the contact portion C9 are illustrated. Furthermore, in the sectional view shown in FIG. 3, the contact portion C1 is formed so as to extend from the drain region 12b of the first load transistor Q1 to the second gate electrode 60. The contact portion for connecting the source/drain region and the wiring layer made of polysilicon at the same time is hereinafter referred to as a common contact portion.

A second interlayer dielectric 200 is formed on the first wiring layers and exposed;portions of the first interlayer dielectric 110. The second interlayer dielectric 200 comprises a three-layered silicon oxide layer in the example shown in FIG. 3. Second contact portions are formed in the second interlayer dielectric 200. The second contact portion, for example, a contact portion C15, may have the same structure as that of the first contact portion.

A second wiring layer 300 is formed on the second interlayer dielectric 200. In FIG. 3, illustrated are a wiring layer 300C functioning as a power source line, a main word line 300B connected to a decoder circuit and a wiring layer 300D1 connected to a pad layer 100P5 through the contact portion C15. The wiring layer 300D1 is connected to a bit line 500A that is a third wiring layer through a contact portion C17.

Next, referring to FIGS. 1 and 4, a sectional view taken along the 4—4 line of FIG. 1 will be described. In FIG. 4, members identical to those illustrated in FIG. 3 will be denoted using the same reference numerals, and detailed explanations for them are omitted.

In FIG. 4, the first driver transistor Q3 and the second driver transistor Q4 are shown. Moreover, a polysilicon wiring layer 50 connected to the drain region 12g of the second driver transistor Q4 is shown. Furthermore, as the first contact portion, illustrated are a contact portion C7 connected to a source region 12e of the first driver transistor Q3, a contact portion C8 connected to a source region 12h of the second driver transistor Q4 and a common contact portion C4 connected to the drain region 12g of the second driver transistor Q4 and the polysilicon wiring layer 50.

In FIG. 4, as me first wiring layers, illustrated are the node wiring layer 70A for connecting the drain region 12b of the first load transistor Q1 and the drain region 12f of the first driver transistor Q3, the node wiring layer 70B for connecting the drain region 12c of the second load transistor Q2 and the drain region 12g of the second driver transistor Q4, and the pad layers 100P3 and 100P4 respectively connected to the contact portions C7 and C8. Furthermore, illustrated are the second wiring layer 300C and third interlayer dielectrics 400 respectively connected to the pad layers 100P3 and 100P4 through the contact portions C13 and C14, and the third wiring layers 500A and 500B functioning as a bit line.

In the aforementioned sectional views shown in FIGS. 3 and 4, although a part of the first wiring layers was mainly described, other first wiring layers have the similar structures to that of the first wiring layers shown in the sectional views of FIGS. 3 and 4. Specifically, the present invention has a feature that the lower conductive layer 710 (see FIG. 5) continuous to the conductive layer which functions as a barrier layer and a conductive layer in the first contact portion is used as the first wiring layer. In the first wiring layers, at least the node wiring layers and the pad layers are included.

As described above, by using the lower conductive layers continuous to the conductive layers of the first contact portions as the first wiring layers, it is possible to reduce the film thickness of the first wiring layers. Accordingly, a fabrication margin in photoetching processes can be reduced, so that more microfabricated wiring pattern can be formed.

Connection Relation of Components

Next, descriptions for connection relation of components will be made with reference to FIGS. 1, 2 and 6.

The first load transistor Q1 has source/drain regions 12a and 12b on both sides of the first gate electrode layer 40, and the source region 12a is connected to the second wiring layer 300A (power source $V_{DD}$) through the contact portion C5, the first pad layer 100P1 and the contact portion C11. The second load transistor Q2 has source/drain regions 12c and 12d on both sides of the second gate electrode layer 60, and the source region 12d is connected to the second wiring layer 300A (power source $V_{DD}$) through the contact portion C6, the second pad layer 100P2 and the contact portion C12.

The first driver transistor Q3 has source/drain regions 12e and 12f on both sides of the first gate electrode layer 40, and the source region 12e is connected to the second wiring layer 300C (power source $V_{SS}$) through the contact portion C7, the third pad layer 100P3 and the contact portion C13. The second driver transistor Q4 has source/drain regions 12g and 12h on both sides of the second gate electrode layer 60, and the source region 12h is connected to the second wiring layer 300C (power source $V_{SS}$) through the contact portion C8, a fourth pad layer 100P4 and the contact portion C14.

The first transfer transistor Q5 has source/drain regions 12i and 12j on both sides of the third gate electrode layer 80, and the source region 12j is connected to the third wiring layer 500A (bit line BL) through the contact portion C9, the fifth pad layer 100P5, the contact portion C15, the second wiring layer 300D1 and the contact portion C17. The second transfer transistor Q6 has source/drain regions 12k and 12l on both sides of the third gate electrode layer 80, and the source: region 12l is connected to the third wiring layer 500B (bit line $\overline{BL}$) through the contact portion C10, the sixth pad layer 100P6, the contact portion C16, the second wiring layer 300D2 and a contact portion C18.

Manufacturing Process

Next, a method of manufacturing a SRAM cell according to this embodiment will be described with reference to FIGS. 1, 3 and 4.

(A) The N type well 14N and the P type well 14P are first formed in the P type silicon substrate 10. Subsequently, the field oxide film 16 surrounding the active region where the transistors are to be formed is formed. The surfaces of the N type well 14N and the P type well 14P exposed in the active region are thermally oxidized, thus forming the insulating layer.

Then, the polysilicon layer is formed on the insulating layer using a CVD method. Thereafter, the polysilicon layer and the insulating layer are partially patterned by photoetching, thus forming the gate insulating layer 126, the first gate electrode layer 40, the polysilicon wiring layer 50, the second gate electrode layer 60 and the third gate electrode layer 80.

(B) After the above process, to form the low concentration impurity diffusion layers for the LDD structure, impurities such as phosphorus or boron are doped by ion-implantation, thus forming the diffusion region. Subsequently, the insulating layer such as a silicon oxide layer or a silicon nitride layer is deposited by a CVD method, and thereafter the insulating layer is entirely etched by dry etching such as RIE. Thus, a side wall insulating layer is formed on each side wall of the gate electrode layers 40, 60 and 80 and polysilicon wiring layer 50.

Subsequently, N type impurities of a high concentration such as phosphorus or arsenic are introduced into the active region of the P type well 14P using the gate electrode layers 40, 60 and 80, the polysilicon wiring layer 50 and the field oxide film 16 as masks. In addition, P type impurities of a high concentration such as boron are introduced into the active region of the N type well 14N. Thus, the source/drain regions 12 adopting the LDD structure are formed. At this time, predetermined N or P type impurities are doped also in the gate electrode layers 40, 60 and 80 and the polysilicon layer 50.

Then, the metal silicide layer 122 is formed on the surface of the exposed portion of the source/drain regions 12 using a known silicide technology, and the metal silicide layer 124 is formed on the surfaces of the exposed portions of the gate electrode layers 40, 60 and 80 and the polysilicon wiring layer 50 using the same.

(C) After the above process, an insulating layer such as PSG (phosphorus-silicate glass) is formed by a CVD method on the surface of the substrate in which the MOS transistors Q1 to Q6 are formed, and the insulating layer is flattened by a chemical mechanical polishing (CMP) method according to demand, thus forming the first interlayer dielectric 110 having a film thickness of 0.1 to 0.8 µm.

Subsequently, the first contact hole is formed in a predetermined region of the first interlayer dielectric 110 by photoetching. At this time, the side wall insulating layer of the polysilicon wiring layer 50 in a region where the common contact portion C4 is formed is removed. And the side wall insulating layer of the gate electrode layer 60 in a region where the common contact portion C1 is formed is removed. Thus, the wiring layers (electrode layers) and the impurity diffusion layers are simultaneously exposed.

(D) Next, as shown in the enlarged sectional view of FIG. 5, the refractory metal layer 712 and the refractory metal nitride layer 714 are formed on the inner surface of the contact hole by sputtering. Subsequently, the plug layer 716 made of, for example, tungsten is formed inside the contact hole. Thereafter, the surface of the plug layer 716 formed in the contact hole is flattened by either an etch back method or a CMP method. At this time, the refractory metal layer 712 and the refractory metal nitride layer 714 formed on the surface of the first interlayer dielectric 110 are left, and they form the lower conductive layer 710.

Subsequently, the refractory metal layer 722 is formed on the surfaces of the refractory metal nitride layer 714 and the plug layer 716 by sputtering. Furthermore, the refractory metal nitride layer 724 is formed on the surface of the refractory metal layer 722 by sputtering. The refractory metal layer 722 and the refractory metal nitride layer 724 form the upper conductive layer 720.

The upper conductive layer 720 and the lower conductive layer 710 are then patterned by photoetching, and the first wiring layers, that is, the node wiring layers 70A and 70B and the pad layers 100P1 to 100P6 are formed.

Refractory metals forming the refractory metal layers 712 and 722 are preferably metals selected from titanium, tungsten, cobalt, molybdenum and the like. As materials forming the plug layer 716, molybdenum, aluminum, doped polysilicon and the like can be used in addition to tungsten.

(E) Subsequent steps can be performed by generally used methods. For example, the first insulating layer is formed by a CVD method, and then the second insulating layer made of SOG (spin on glass) is formed by spin coating. Further, the third insulating layer is formed by a CVD method, and the surface of the third insulating layer is flattened by a CMP method if necessary. Thus, the second interlayer dielectric 200 is formed. Thereafter, the second contact portions C11 to C16 (see FIG. 2) which are connected to the pad layers 100P1 to 100P6 respectively are formed at predetermined regions of the second interlayer dielectric 200.

Subsequently, the second wiring layers 300A, 300B and 300C are formed by aluminum, aluminum alloy or the like. After the third insulating layer 400 is formed by a CVD method or the like, the third contact portions C17 and C18 are formed at predetermined regions. The third wiring layers 500A and 500B are then formed by aluminum, aluminum alloy or the like.

Another Embodiment

Figure 8:
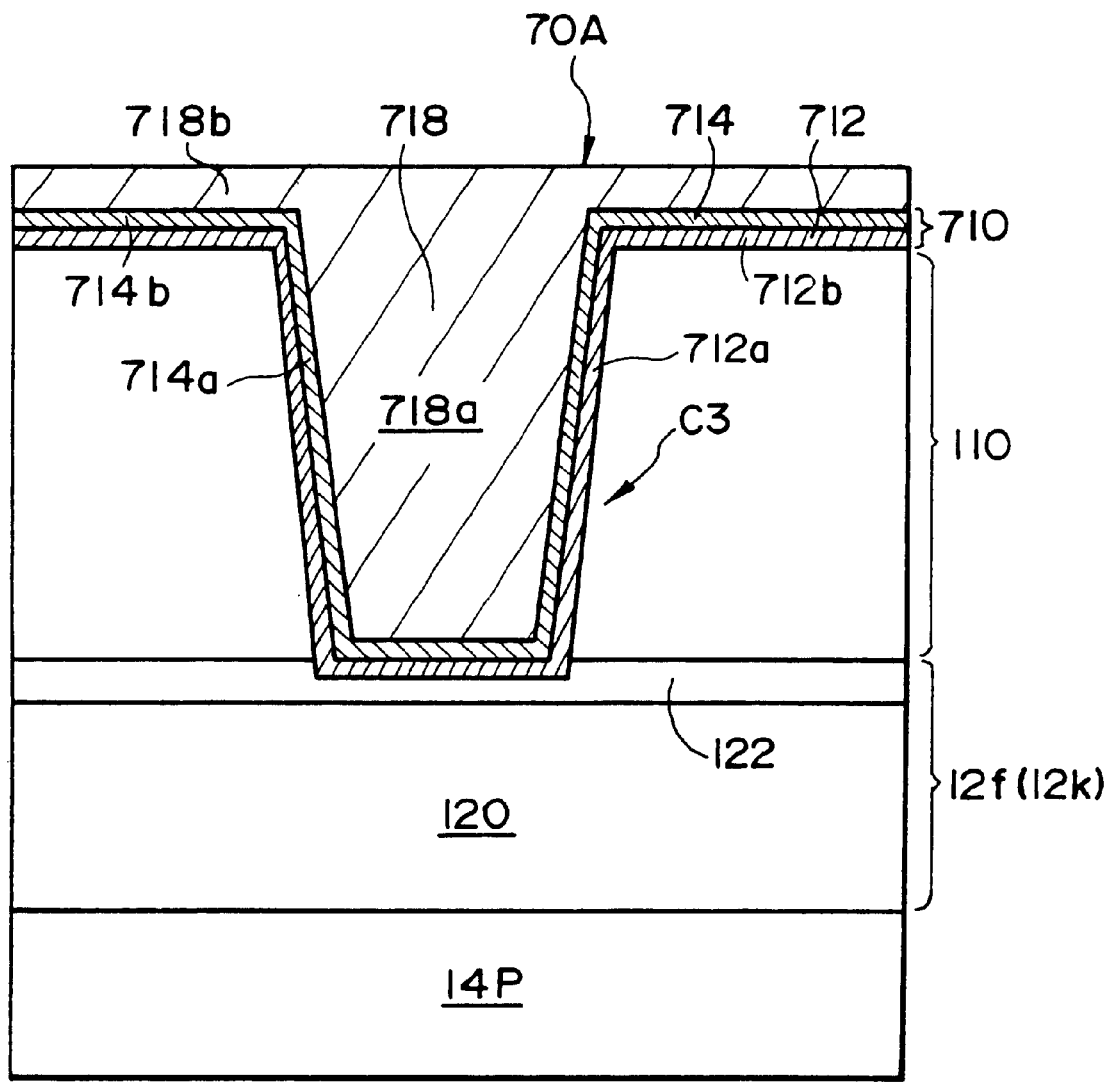
FIG. 8 is a sectional view showing another embodiment illustrating aspects of the present invention.
Figure 9:
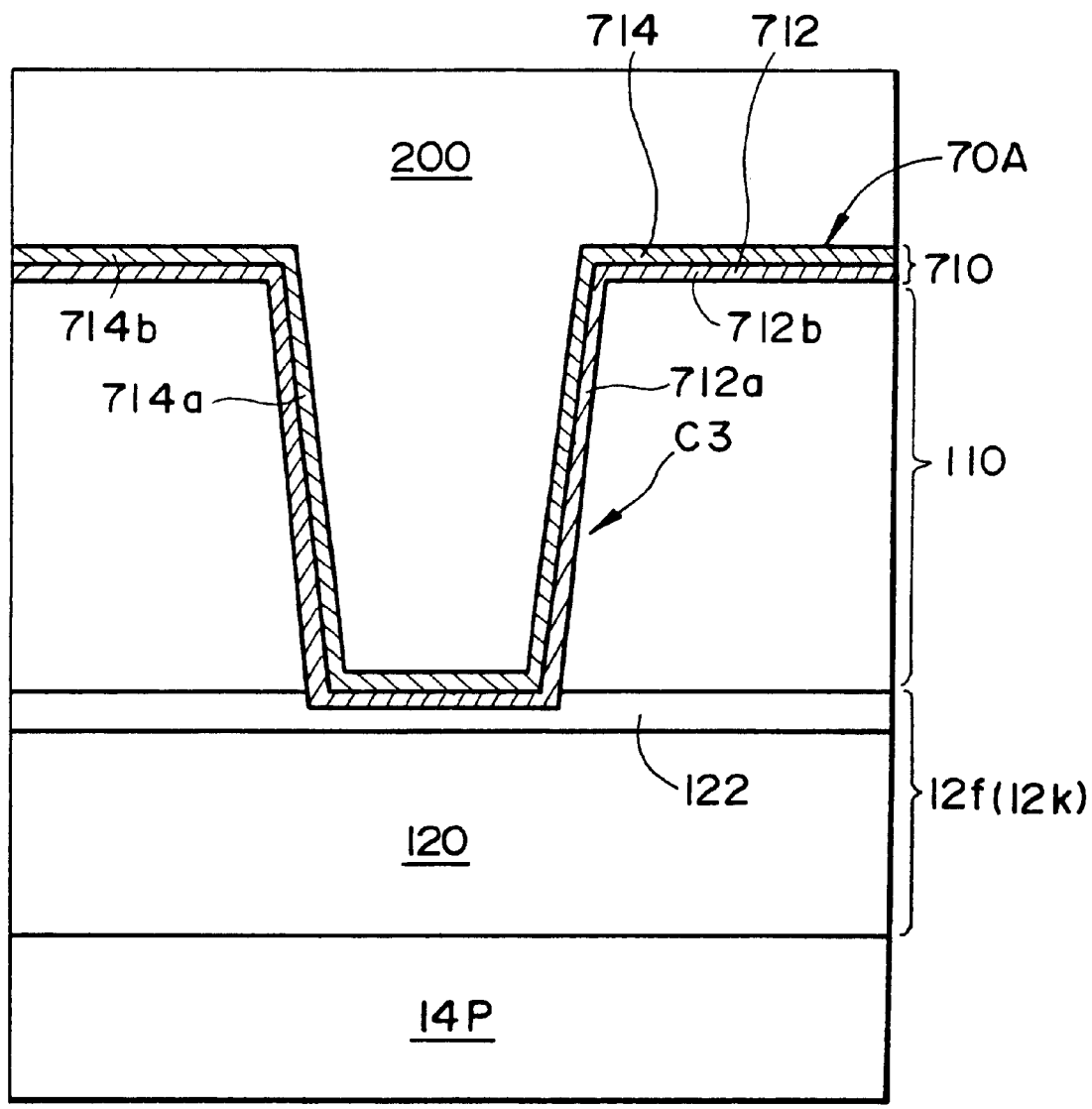
FIG. 9 is a sectional view showing still another embodiment illustrating aspects of the present invention.

A modification of the first contact portion is shown in FIGS. 8 and 9. In FIGS. 8 and 9, members essentially identical to those illustrated in FIG. 5 will be denoted using the same reference numerals, and detailed explanations for them are omitted.

In the modification example illustrated in FIG. 8, in stead of the plug layer 716 of the contact portion adopting the structure shown in FIG. 5, a conductive layer 718 is used as a metal forming the plug layer. The conductive layer 718 is formed on the surface of the refractory metal nitride layer 714 which forms the lower conductive layer 710 so that a predetermined film thickness is formed thereon. The conductive layer 718 is formed by an integration of the plug layer 718a and the upper conductive layer 718b. This structure requires no process for forming the upper conductive layer 720 of the foregoing embodiment, and is advantageous for the manufacture.

In the modification example shown in FIG. 9, the first wiring layer has not the upper conductive layer 720 illustrated in FIG. 5. In other words, the first wiring layer is formed of the lower conductive layer 710 alone, which substantially has a function to serve as a barrier layer. The inside of the contact portion is formed by an insulator. This insulator can be formed in the step for forming the second interlayer dielectric 200. Also this structure requires no process for forming the upper conductive layer 720, and is advantageous for the manufacturing process.

As described above, according to the semiconductor memory device of the present invention, the conductive layers (lower conductive layers) formed in the same step for forming the conductive layers and barrier layers of the first contact portions are also used as the first wiring layers, so that wiring layers having small film thickness can be formed. Accordingly, a focus margin can be reduced in patterning the first wiring layers, resulting in enhancement of the integration degree of wiring layers and an increase in a yield.

The present invention is not limited to the foregoing embodiments, and various modifications and alternations can be made therein without departing from spirit and scope of the invention.

What is claimed is:

1. A semiconductor memory device comprising memory cells each of which includes two load transistors, two driver transistors and two transfer transistors, the semiconductor memory device comprising:
    a semiconductor substrate on which transistors are formed;
    a first interlayer dielectric formed on the semiconductor substrate;
    first contact portions formed in the first interlayer dielectric; and
    first wiring layers formed on the first interlayer dielectric,
    wherein the first contact portions include metal layers made of a refractory metal nitride layer directly on a refractory metal layer, and plug layers,
    the first wiring layers include lower conductive layers having the metal layers made of the refractory metal nitride layer directly on the refractory metal layer, and upper conductive layers formed on the lower conductive layers,
    wherein the upper conductive layers include other metal layers made of another refractory metal nitride layer directly on another refractory metal layer.

2. The semiconductor memory device according to claim 1, wherein the first contact portions are continuous with the lower conductive layers of the first wiring layer.

3. The semiconductor memory device according to claim 1, wherein the first wiring layer includes node wiring layers for connecting impurity diffusion layers of the load transistors and impurity diffusion layers of the driver transistors.

4. The semiconductor memory device according to claim 1, further comprising second contact portions, wherein the first wiring layer includes at least one pad layer for connecting the first contact portions and the second contact portions.

5. A semiconductor memory device comprising memory cells each of which includes two load transistors, two driver transistors and two transfer transistors, the semiconductor memory device comprising:
    a semiconductor substrate on which transistors are formed;
    a first interlayer dielectric formed on the semiconductor substrate;
    first contact portions formed in the first interlayer dielectric; and
    first wiring layers formed on the first interlayer dielectric,
    wherein the first contact portions include the lower conductive layers made of a refractory metal nitride layer directly on a refractory metal layer, and a plug material; and
    wherein the first wiring layers include the lower conductive layers that include the metal layers made of the refractory metal nitride layer directly on the refractory metal layer, and upper conductive layers that include other metal layers made of another refractory metal nitride layer directly on another refractory metal layer.

6. The semiconductor memory device according to claim 5, wherein the lower conductive layers are continuous to the first contact portions.

7. The semiconductor memory device according to claim 5, wherein the another refractory metal layer directly contacts the plug material.

8. A semiconductor memory device comprising memory cells each of which includes two load transistors, two driver transistors and two transfer transistors, the semiconductor memory device comprising:
    a semiconductor substrate on which transistors are formed;
    a first interlayer dielectric formed on the semiconductor substrate;
    first contact portions formed in the first interlayer dielectric;
    a first wiring layer formed on the first interlayer dielectric;
    a second interlayer dielectric formed on the first interlayer dielectric; and
    second contact portions formed in the second interlayer dielectric,
    wherein the first contact portions and the first wiring layer include metal layers made of a refractory metal layer and a refractory metal nitride layer; and
    wherein the first wiring layer includes pad layers for connecting the first contact portions and the second contact portions.

9. A semiconductor memory device according to claim 8, wherein the first contact portion includes a plug layer.

10. The semiconductor memory device according to claim 8, wherein the first contact portions are continuous with the first wiring layer.

11. The semiconductor memory device according to claim 8, wherein the first wiring layer includes node wiring layers for connecting impurity diffusion layers of the load transistors and impurity diffusion layers of the driver transistors.

12. The semiconductor memory device according to claim 8, wherein the first wiring layer comprises metal layers made of refractory metal and refractory metal nitride layers.

13. The semiconductor memory device according to claim 8, wherein the first wiring layer further includes conductive layers continued to plug layers which form the first contact portions.

* * * * *